US011267366B2

(12) United States Patent
Wang et al.

(10) Patent No.: US 11,267,366 B2
(45) Date of Patent: Mar. 8, 2022

(54) INTEGRATED TRACTION INVERTER DC BUSBAR

(71) Applicant: FORD GLOBAL TECHNOLOGIES, LLC, Dearborn, MI (US)

(72) Inventors: Fan Wang, Novi, MI (US); Lihua Chen, Farmington Hills, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 224 days.

(21) Appl. No.: 16/571,965

(22) Filed: Sep. 16, 2019

(65) Prior Publication Data
US 2021/0078446 A1    Mar. 18, 2021

(51) Int. Cl.
| | | |
|---|---|---|
| *B60M 1/30* | (2006.01) | |
| *B60L 50/61* | (2019.01) | |
| *B60L 15/00* | (2006.01) | |
| *H02M 7/00* | (2006.01) | |
| *H02G 5/00* | (2006.01) | |
| *H05K 7/14* | (2006.01) | |

(52) U.S. Cl.
CPC .............. *B60M 1/30* (2013.01); *B60L 15/007* (2013.01); *B60L 50/61* (2019.02); *H02G 5/005* (2013.01); *H02M 7/003* (2013.01); *H05K 7/1432* (2013.01); *B60L 2210/42* (2013.01)

(58) Field of Classification Search
CPC .... B60L 50/61; B60L 2210/42; B60L 15/007; B60M 1/30; H02G 5/005; H02M 7/003; H05K 7/1432
See application file for complete search history.

(56) References Cited

U.S. PATENT DOCUMENTS

| | | | | |
|---|---|---|---|---|
| 7,869,193 | B2 | 1/2011 | Nohara et al. | |
| 9,159,506 | B2 | 10/2015 | Matsuo et al. | |
| 9,257,825 | B2 | 2/2016 | Kalayjian et al. | |
| 10,405,466 | B1* | 9/2019 | Pradeepkumar | B60L 50/50 |
| 10,717,366 | B1* | 7/2020 | Jaksic | B60M 1/30 |
| 2005/0265002 | A1* | 12/2005 | Armstrong | H05K 7/20909 361/719 |
| 2009/0023345 | A1* | 1/2009 | Matsumoto | H02M 7/003 439/720 |
| 2017/0099010 | A1* | 4/2017 | Dziuba | H02M 7/003 |
| 2017/0338002 | A1* | 11/2017 | Ansari | B60L 58/10 |
| 2017/0358897 | A1* | 12/2017 | Young | H02G 5/005 |
| 2018/0342722 | A1* | 11/2018 | Zeng | H01M 10/0585 |
| 2019/0020013 | A1* | 1/2019 | Zeng | B60L 50/64 |

(Continued)

*Primary Examiner* — Timothy J Thompson
*Assistant Examiner* — Rhadames Alonzo Miller
(74) *Attorney, Agent, or Firm* — Brooks Kushman PC; David Kelley (57) ABSTRACT

A power module includes one of more bus capacitors and one or more power switching modules. The bus capacitors and power switching modules have positive and negative terminals. The positive terminals of the bus capacitors are arranged diagonally opposite to the positive terminals of the power switching modules. The negative terminals of the bus capacitors are arranged diagonally opposite to the negative terminals of the power switching modules. A laminated busbar assembly connects a positive conducting layer to the positive terminals and a negative conducting layer to the negative terminals. The laminated busbar assembly includes sets of tabs arranged diagonally opposite one another to match the arrangement of the terminals.

14 Claims, 5 Drawing Sheets

(56) References Cited

U.S. PATENT DOCUMENTS

2019/0067160 A1\* 2/2019 Xu ............................ H01L 25/18
2019/0280611 A1\* 9/2019 Chung ................. H02M 7/5387
2020/0274307 A1\* 8/2020 Young ................... H01L 23/492

\* cited by examiner

INTEGRATED TRACTION INVERTER DC BUSBAR

TECHNICAL FIELD

This application generally relates to a busbar for coupling a DC link capacitor and an inverter power module in an integrated traction module.

BACKGROUND

Hybrid-electric and electric vehicles operate using electrical power. Electrified vehicles generally have a relatively large current requirement. Connection systems for electrified vehicles are designed to connect devices to handle the current requirements. However, typical connection systems can introduce stray inductances that affect system operation. For example, the stray inductance can affect surge voltages and power device switching losses.

SUMMARY

A busbar assembly includes a lower conductive layer defining a first set of openings for passage of terminals therethrough and including a first set of tabs adjacent to some of the first set of openings and extending generally perpendicular from the lower conductive layer for attaching to terminals of a first polarity. The busbar assembly includes an upper conductive layer defining a second set of openings generally aligned with the first set for passage of terminals and including a second set of tabs adjacent to a subset of the second set of openings and extending generally perpendicular from the upper conductive layer for attaching to terminals of a second polarity, wherein the first set of tabs extends through the openings of the second set. The busbar assembly includes an insulation layer between the lower conductive layer and the upper conductive layer.

The first set of tabs may include a first subset and a second subset of tabs and the first subset of tabs may be arranged on the lower conductive layer diagonally opposite to the second subset of tabs. The second set of tabs may include a third subset and a fourth subset of tabs and the third subset may be arranged on the upper conductive layer diagonally opposite to a fourth subset of tabs. The lower conductive layer and the upper conductive layer may be generally shaped as a rectangle and the first subset, the second subset, the third subset, and the fourth subset may each be located in a different quadrant of the rectangle. The first and second sets of tabs may be bent from conductive material of the lower conductive layer and the upper conductive layer, respectively. The first and second sets of tabs may be comprised of conductive material attached to the lower conductive layer and the upper conductive layer, respectively. The tabs may be configured such that there are a predetermined number of tab elements associated with each of the openings that are adjacent to the tabs. The tabs may be configured such that there is a single tab extending across a length of an adjacent one of the openings. The first set of openings may include a first subset of openings that are directly adjacent to each of the tabs of the first set of tabs and a second subset of openings that are not directly adjacent to any of the tabs of the first set. An area defined by each of the openings of the first subset may be less than an area defined by each of the openings of the second subset. The second set of openings may include a third subset of openings that are directly adjacent to each of the tabs of the second set of tabs and a fourth subset of openings that are not directly adjacent to any of the tabs of the second set. An area defined by each of the openings of the third subset may be less than an area defined by each of the openings of the fourth subset. The fourth subset of openings may be aligned with the first set of tabs such that the first set of tabs pass through the fourth subset of openings and are exposed above the upper conductive layer. The lower conductive layer and the upper conductive layer may include tabs formed at an edge of the respective layer configured to contact connecting terminals.

A traction inverter includes a plurality of power switching stages configured to convert a DC voltage between a first set of positive and negative terminals to an AC current at output terminals. The traction inverter includes a plurality of capacitors having a second set of positive and negative terminals. The traction inverter includes a housing configured to receive and arrange the power switching stages and the capacitors such that the first set and the second set of positive and negative terminals extend from a surface of the housing and the first set of positive terminals are diagonally opposite to the second set of positive terminals and the first set of negative terminals are diagonally opposite to the second set of negative terminals. The traction inverter includes a lower busbar conductive layer defining a first set of openings through which the first set and the second set of positive and negative terminals pass and including a first set of tabs extending generally perpendicular from the lower busbar conductive layer and attached to the negative terminals. The traction inverter includes an upper busbar conductive layer defining a second set of openings generally aligned with the first set of openings through which the positive and negative terminals pass and including a second set of tabs extending generally perpendicular from the upper busbar conductive layer and attached to the positive terminals, wherein the first set of tabs extends through some of the openings of the second set. The traction inverter includes a busbar insulation layer between the lower busbar conductive layer and the upper busbar conductive layer.

The first and second sets of tabs may be formed from bending conductive material of the lower busbar conductive layer and the upper busbar conductive layer, respectively. The first set and the second set of tabs may be comprised of conductive material attached to the lower conductive layer and the upper conductive layer, respectively.

A vehicle includes a high-voltage bus coupled to a traction battery and a traction inverter including power switching stages and capacitors having positive and negative terminals, wherein the positive and negative terminals of the power switching stages and the capacitors are arranged such that terminals of the power switching stages having a same polarity as terminals of the capacitors are positioned diagonally opposite on a surface defined by a housing in which the power switching stages and capacitors are mounted. The vehicle includes a laminated busbar configured to couple the high-voltage bus to the positive and negative terminals. The laminated busbar includes a lower conductive layer defining a first set of openings through which the positive and negative terminals pass and including a first set of tabs extending generally perpendicular from the lower conductive layer and attached to the negative terminals. The laminated busbar includes an upper conductive layer defining a second set of openings generally aligned with the first set through which the positive and negative terminals pass and including a second set of tabs extending generally perpendicular from the upper conductive layer and attached to the positive terminals, wherein the first set of tabs extends through some of the openings of the second set. The laminated busbar includes an insulation layer between the lower conductive layer and the upper conductive layer.

The first and second sets of tabs may be formed from bending conductive material of the lower conductive layer and the upper conductive layer, respectively. The first set and the second set of tabs may be comprised of conductive material attached to the lower conductive layer and the upper conductive layer, respectively.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
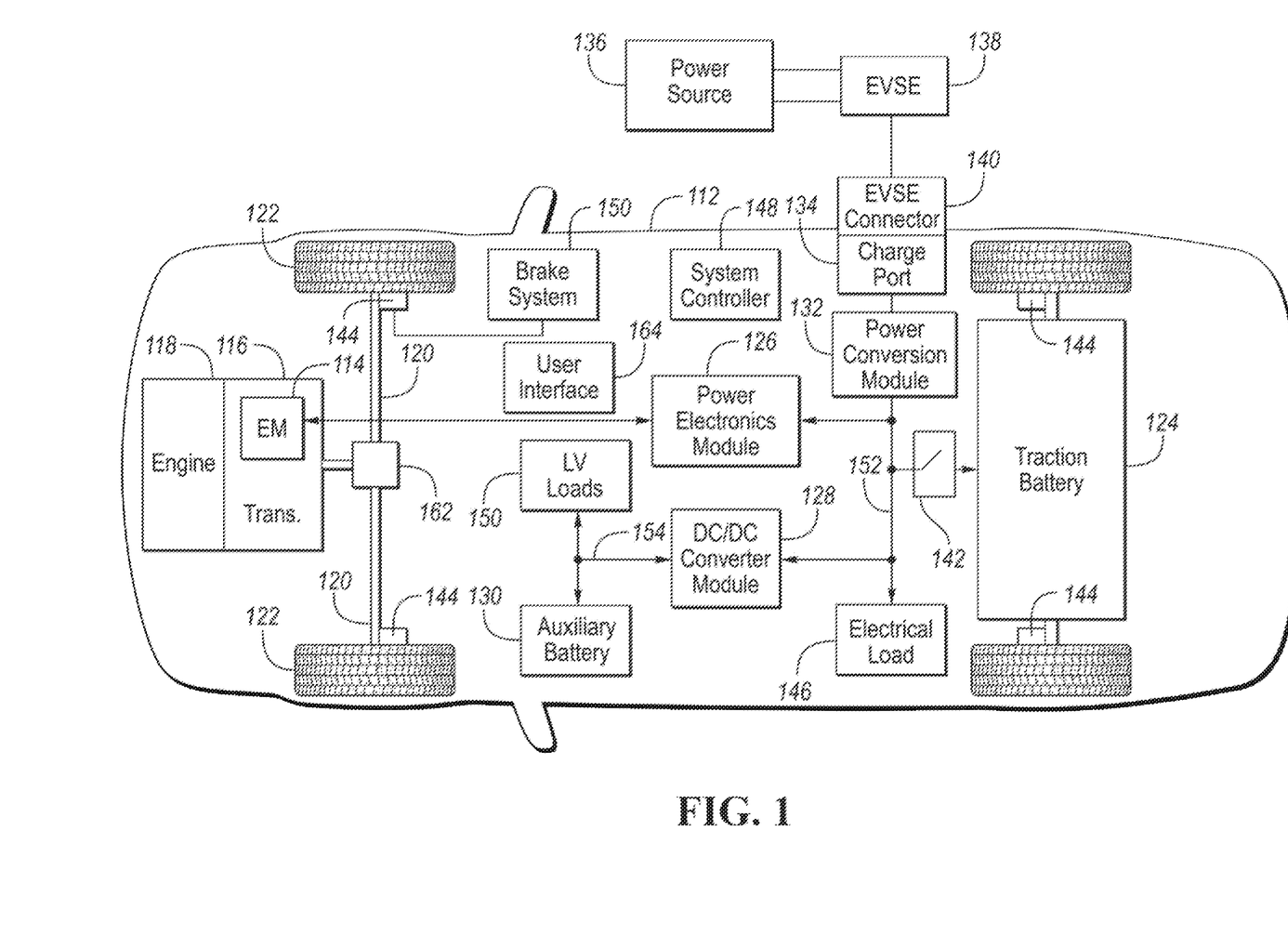
FIG. 1 is a diagram of an electrified vehicle illustrating drivetrain and energy storage components including an electric machine.

FIG. 1 depicts an electrified vehicle 112 that may be referred to as a plug-in hybrid-electric vehicle (PHEV). A plug-in hybrid-electric vehicle 112 may comprise one or more electric machines 114 mechanically coupled to a hybrid transmission 116. The electric machines 114 may be capable of operating as a motor or a generator. In addition, the hybrid transmission 116 is mechanically coupled to an engine 118. The hybrid transmission 116 is also mechanically coupled to a drive shaft 120 that is mechanically coupled to the wheels 122. The electric machines 114 can provide propulsion and braking capability when the engine 118 is turned on or off. The electric machines 114 may also act as generators and can provide fuel economy benefits by recovering energy that would normally be lost as heat in a friction braking system. The electric machines 114 may also reduce vehicle emissions by allowing the engine 118 to operate at more efficient speeds and allowing the hybrid-electric vehicle 112 to be operated in electric mode with the engine 118 off under certain conditions. An electrified vehicle 112 may also be a battery electric vehicle (BEV). In a BEV configuration, the engine 118 may not be present.

A traction battery or battery pack 124 stores energy that can be used by the electric machines 114. The vehicle battery pack 124 may provide a high voltage direct current (DC) output. The traction battery 124 may be electrically coupled to one or more power electronics modules 126 (may also be referred to as a traction inverter). One or more contactors 142 may isolate the traction battery 124 from other components when opened and connect the traction battery 124 to other components when closed. The power electronics module 126 is also electrically coupled to the electric machines 114 and provides the ability to bi-directionally transfer energy between the traction battery 124 and the electric machines 114. For example, a traction battery 124 may provide a DC voltage while the electric machines 114 may operate with a three-phase alternating current (AC) to function. The power electronics module 126 may convert the DC voltage to a three-phase AC current to operate the electric machines 114. In a regenerative mode, the power electronics module 126 may convert the three-phase AC current from the electric machines 114 acting as generators to the DC voltage compatible with the traction battery 124.

The vehicle 112 may include a variable-voltage converter (VVC) (not shown) electrically coupled between the traction battery 124 and the power electronics module 126. The VVC may be a DDC boost converter configured to increase or boost the voltage provided by the traction battery 124. By increasing the voltage, current requirements may be decreased leading to a reduction in wiring size for the power electronics module 126 and the electric machines 114. Further, the electric machines 114 may be operated with better efficiency and lower losses.

In addition to providing energy for propulsion, the traction battery 124 may provide energy for other vehicle electrical systems. The vehicle 112 may include a DC/DC converter module 128 that converts the high voltage DC output of the traction battery 124 to a low voltage DC supply that is compatible with low-voltage vehicle loads. An output of the DCDC converter module 128 may be electrically coupled to an auxiliary battery 130 (e.g., 12V battery) for charging the auxiliary battery 130. The low-voltage systems may be electrically coupled to the auxiliary battery 130. One or more electrical loads 146 may be coupled to the high-voltage bus. The electrical loads 146 may have an associated controller that operates and controls the electrical loads 146 when appropriate. Examples of electrical loads 146 may be a fan, an electric heating element and/or an air-conditioning compressor.

The electrified vehicle 112 may be configured to recharge the traction battery 124 from an external power source 136. The external power source 136 may be a connection to an electrical outlet. The external power source 136 may be electrically coupled to a charger or electric vehicle supply equipment (EVSE) 138. The external power source 136 may be an electrical power distribution network or grid as provided by an electric utility company. The EVSE 138 may provide circuitry and controls to regulate and manage the transfer of energy between the power source 136 and the vehicle 112. The external power source 136 may provide DC or AC electric power to the EVSE 138. The EVSE 138 may have a charge connector 140 for plugging into a charge port 134 of the vehicle 112. The charge port 134 may be any type of port configured to transfer power from the EVSE 138 to the vehicle 112. The charge port 134 may be electrically coupled to a charger or on-board power conversion module 132. The power conversion module 132 may condition the power supplied from the EVSE 138 to provide the proper voltage and current levels to the traction battery 124. The power conversion module 132 may interface with the EVSE 138 to coordinate the delivery of power to the vehicle 112. The EVSE connector 140 may have pins that mate with corresponding recesses of the charge port 134. Alternatively, various components described as being electrically coupled or connected may transfer power using a wireless inductive coupling.

One or more wheel brakes 144 may be provided for braking the vehicle 112 and preventing motion of the vehicle 112. The wheel brakes 144 may be hydraulically actuated, electrically actuated, or some combination thereof. The wheel brakes 144 may be a part of a brake system 150. The brake system 150 may include other components to operate the wheel brakes 144. For simplicity, the figure depicts a single connection between the brake system 150 and one of the wheel brakes 144. A connection between the brake system 150 and the other wheel brakes 144 is implied. The brake system 150 may include a controller to monitor and coordinate the brake system 150. The brake system 150 may monitor the brake components and control the wheel brakes 144 for slowing the vehicle. The brake system 150 may respond to driver commands and may also operate autonomously to implement features such as stability control. The controller of the brake system 150 may implement a method of applying a requested brake force when requested by another controller or sub-function.

Electronic modules in the vehicle 112 may communicate via one or more vehicle networks. The vehicle network may include a plurality of channels for communication. One channel of the vehicle network may be a serial bus such as a Controller Area Network (CAN). One of the channels of the vehicle network may include an Ethernet network defined by Institute of Electrical and Electronics Engineers (IEEE) 802 family of standards. Additional channels of the vehicle network may include discrete connections between modules and may include power signals from the auxiliary battery 130. Different signals may be transferred over different channels of the vehicle network. For example, video signals may be transferred over a high-speed channel (e.g., Ethernet) while control signals may be transferred over CAN or discrete signals. The vehicle network may include any hardware and software components that aid in transferring signals and data between modules. The vehicle network is not shown in FIG. 1 but it may be implied that the vehicle network may connect to any electronic module that is present in the vehicle 112. A vehicle system controller (VSC) 148 may be present to coordinate the operation of the various components.

Figure 2:
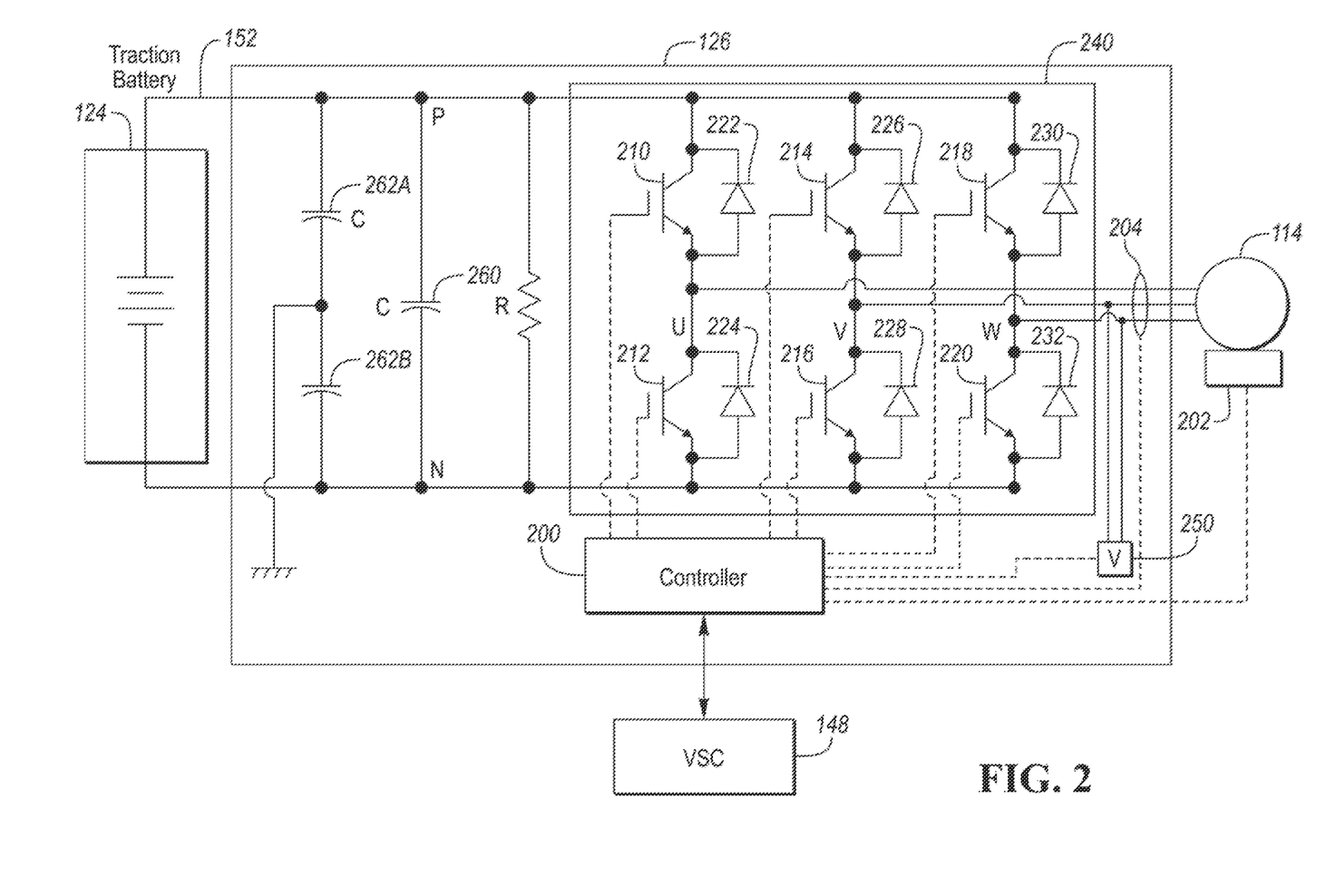
FIG. 2 is a diagram of a power inverter for an electric machine.

The electric machines 114 may be coupled to the power electronics module 126 via one or more conductors that are associated with each of the phase windings. FIG. 2 depicts a block diagram of a portion of an electric drive system for a vehicle. The vehicle 112 may include one or more power electronics controllers 200 configured to monitor and control the components of the power electronics module 126. The conductors may be part of a wiring harness between the electric machine 114 and the power electronics module 126. A three-phase electric machine 114 may have three conductors coupled to the power electronics module 126. The power electronics module 126 may be configured to switch positive and negative terminals of the high-voltage bus 152 to phase terminals of the electric machines 114. The power electronics module 126 may be controlled to provide a pulse-width modulated (PWM) voltage and sinusoidal current signals to the electric machine 114. The frequency of the signals may be proportional to the rotational speed of the electric machine 114. The controller 200 may be configured to adjust the voltage and current output of the power electronics module 126 at a predetermined switching frequency. The switching frequency may be the rate at which the states of switching devices within the power electronics module 126 are changed.

The power electronics module 126 may interface with a position/speed feedback device 202 that is coupled to the rotor of the electric machine 114. For example, the position/speed feedback device 202 may be a resolver or an encoder. The position/speed feedback device 202 may provide signals indicative of a position and/or speed of the rotor of the electric machine 114. The power electronics 126 may include a power electronics controller 200 that interfaces to the speed feedback device 202 and processes signals from the speed feedback device 202. The power electronics controller 200 may be programmed to utilize the speed and position feedback to control the power electronics module 126 to operate the electric machine 114.

The traction inverter or power electronics module 126 may include power switching circuitry 240 that includes a plurality of switching devices 210, 212, 214, 216, 218, 220. The switching devices 210, 212, 214, 216, 218, 220 may be Insulated Gate Bipolar Transistors (IGBT), Metal Oxide Semiconductor Field Effect Transistors (MOSFET), or other solid-state switching devices. The switching devices 210, 212, 214, 216, 218, 220 may be configured to selectively couple a positive terminal and a negative terminal of the high-voltage bus 152 to each phase terminal or leg (e.g., labeled U, V, W) of the electric machine 114. The power electronics 126 may be configured to provide a U-phase voltage, a V-phase voltage and a W-phase voltage to the electric machine 114. Each of the switching devices 210, 212, 214, 216, 218, 220 within the power switching circuitry 240 may have an associated diode 222, 224, 226, 228 230, 232 connected in parallel to provide a path for inductive current when the switching device is in a non-conducting state. Each of the switching devices 210, 212, 214, 216, 218, 220 may have a control terminal for controlling operation of the associated switching device. The control terminals may be electrically coupled to the power electronics controller 200. The power electronics controller 200 may include associated circuitry to drive and monitor the control terminals. For example, the control terminals may be coupled to the gate input of the solid-state switching devices.

A phase leg of the inverter 126 may include switching devices and circuitry configured to selectively connect a phase terminal of the electric machine 114 to each terminal of the high-voltage bus 152. A first switching device 210 may selectively couple the HV-bus positive terminal to a first phase terminal (e.g., U) of the electric machine 114. A first diode 222 may be coupled in parallel to the first switching device 210. A second switching device 212 may selectively couple the HV-bus negative terminal to the first phase terminal (e.g., U) of the electric machine 114. A second diode 224 may be coupled in parallel to the second switching device 212. A first inverter phase leg may include the first switching device 210, the first diode 222, the second switching device 212, and the second diode 224.

A third switching device 214 may selectively couple the HV-bus positive terminal to a second phase terminal (e.g., V) of the electric machine 114. A third diode 226 may be coupled in parallel to the third switching device 214. A fourth switching device 216 may selectively couple the HV-bus negative terminal to the second phase terminal (e.g., V) of the electric machine 114. A fourth diode 228 may be coupled in parallel to the fourth switching device 216. A second inverter phase leg may include the third switching device 214, the third diode 226, the fourth switching device 216, and the fourth diode 228.

A fifth switching device 218 may selectively couple the HV-bus positive terminal to a third phase terminal (e.g., W) of the electric machine 114. A fifth diode 230 may be coupled in parallel to the fifth switching device 218. A sixth switching device 220 may selectively couple the HV-bus negative terminal to the third phase terminal (e.g., W) of the electric machine 114. A sixth diode 232 may be coupled in parallel to the sixth switching device 220. A third inverter phase leg may include the fifth switching device 218, the fifth diode 230, the sixth switching device 220, and the sixth diode 232.

The power switching devices 210, 212, 214, 216, 218, 220 may include two terminals that handle the high-power current through the power switching device. For example, an IGBT includes a collector (C) terminal and an emitter (E) terminal and a MOSFET includes a drain terminal (D) and a source (S) terminal. The power switching devices 210, 212, 214, 216, 218, 220 may further include one or more control inputs. For example, the power switching devices 210, 212, 214, 216, 218, 220 may include a gate terminal (G) and a Kelvin source/emitter (K) terminal. The G and K terminals may comprise a gate loop to control the power switching device.

The traction inverter 126 may be configured to flow a rated current and have an associated power rating. Some applications may demand higher power and/or current ratings' for proper operation of the electric machine 114. The power switching circuitry 240 may be designed to include power switching devices 210, 212, 214, 216, 218, 220 that can handle the desired power/current rating. The desired power/current rating may also be achieved by using power switching devices that are electrically coupled in parallel. Power switching devices may be electrically coupled in parallel and controlled with a common control signal so that each power switching device flows a portion of the total current towing to/from the load.

The power electronics controller 200 may be programmed to operate the switching devices 210, 212, 214, 216, 218, 220 to control the voltage and current applied to the phase windings of the electric machine 114. The power electronics controller 200 may operate the switching devices 210, 212, 214, 216, 218, 220 so that each phase terminal is coupled to only one of the HV-bus positive terminal or the HV-bus negative terminal at a particular time.

Various motor control algorithms and strategies are available to be implemented in the power electronics controller 200. The power electronics module 126 may also include current sensors 204. The current sensors 204 may be inductive or Hall-effect devices configured to generate a signal indicative of the current passing through the associated circuit. In some configurations, two current sensors 204 may be utilized and the third phase current may be calculated from the two measured currents. The controller 200 may sample the current sensors 204 at a predetermined sampling rate. Measured values of the phase currents of the electric machine 114 may be stored in controller memory for later computations.

The power electronics module 126 may include one or more voltage sensors. The voltage sensors may be configured to measure an input voltage to the power electronics module 126 and/or one or more of the output voltages of the power electronics module 126. The power electronics module 126 may include a line voltage sensor 250 that is configured to measure a line voltage across the V and W phase outputs. The voltage may be a voltage difference between the V-phase voltage and the W-phase voltage. The voltage sensors may be resistive networks and include isolation elements to separate high-voltage levels from the low-voltage system. In addition, the power electronics module 126 may include associated circuitry for scaling and filtering the signals from the current sensors 204 and the voltage sensors. In some configurations, each phase leg of the inverter may have corresponding voltage and current sensors.

Under normal operating conditions, the power electronics controller 200 controls operation of the electric machine 114. For example, in response to torque and/or speed setpoints, the power electronics controller 200 may operate the switching devices 210, 212, 214, 216, 218, 220 to control the torque and speed of the electric machine 114 to achieve the setpoints. The torque and/or speed setpoints may be processed to generate a desired switching pattern for the switching devices 210, 212, 214, 216, 218, 220. The control terminals of the switching devices 210, 212, 214, 216, 218, 220 may be driven with PWM signals to control the torque and speed of the electric machine 114. The power electronics controller 200 may implement various well-known control strategies to control the electric machine 114 using the switching devices such as vector control and/or six-step control. During normal operating conditions, the switching devices 210, 212, 214, 216, 218, 220 are actively controlled to achieve a desired current through each phase of the electric machine 114.

The power electronics module 126 may also include one or more bus capacitors 260 that are coupled across the positive and negative conductors of the high-voltage bus 152. The bus capacitors 260 may smooth the voltage of the high-voltage bus 152. The power electronics module 126 may also include one or more capacitors 262 coupled between the conductors of the high-voltage bus 152 and a chassis ground.

Figure 3:
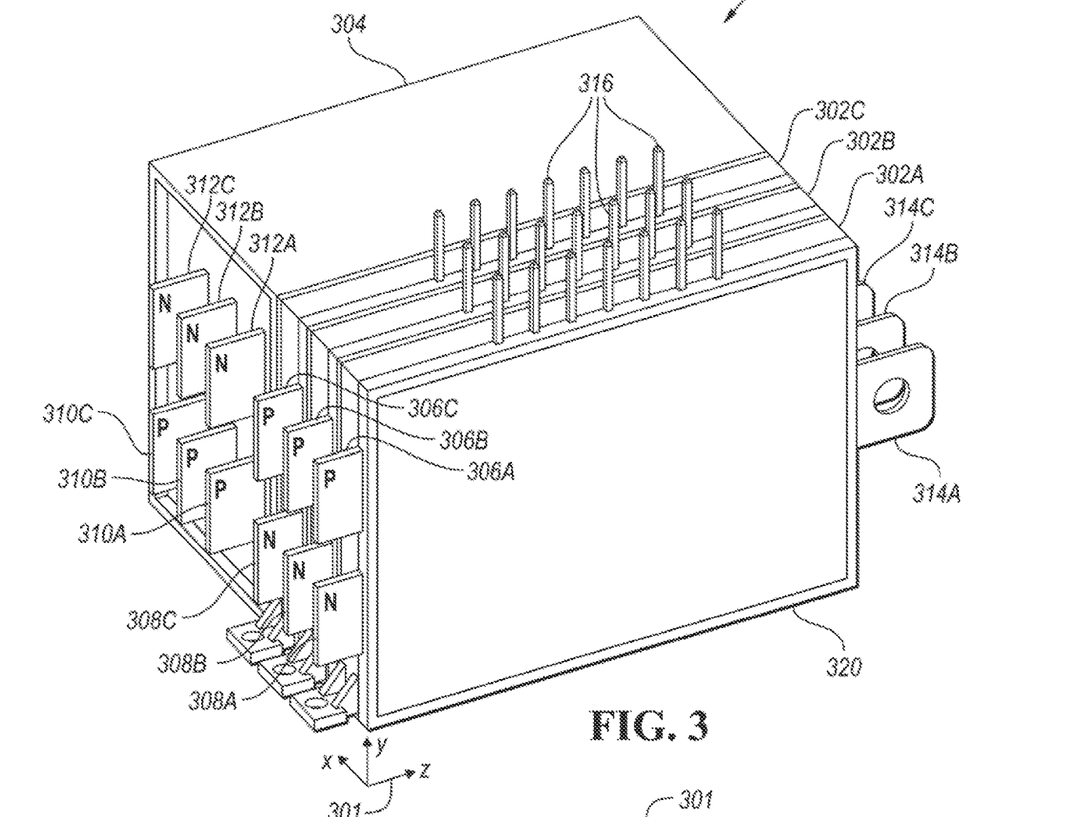
FIG. 3 depicts an example of a power module including a power inverter and bus capacitors.

FIG. 3 depicts a possible arrangement for a power module 300 that includes traction inverter functionality and integrated DC bus capacitors. FIG. 2 may represent an electrical schematic and functionality of the power module 300 and FIG. 3 may represent the physical packaging of the power module 300. The power module 300 may include a plurality of power switching modules 302. Each power switching module 302 may have a corresponding phase terminal 314 for connection to a phase of an electric machine. Each of the power switching modules 302 may be configured to implement a phase leg of the inverter 126. The power switching modules 302 may receive DC input power from a high-side or positive terminal 306 and a low-side or negative terminal 308. Each power switching module 302 may implement a phase leg of the traction inverter 126 that selectively couples each of the phase terminals 314 to each terminal of the high-voltage DC bus 152 by a pair of power switching devices. For a three-phase electric machine, the power module 300 may include three power switching modules 302 to implement the inverter function.

Each of the power switching modules 302 may include a set of control terminals 316. The control terminals 316 may include gate signals for the switching devices and feedback signals such as voltage or current. The control terminals 316 may be electrically coupled to the power electronics controller 200.

The power module 300 may include a housing 320 that is configured to receive and arrange the power switching modules 302. For example, the housing 320 may include slots for inserting each of the power switching modules 302. The housing 320 may also include features for securing the power switching modules 302 to prevent movement due to vibrations. The power module 300 may be configured to handle a different number of power switching modules 302 by including more positions within the housing 320. The configuration provides a flexible architecture for the power module 300 that allows a variety of applications to be implemented with common components.

The positive terminals 306 and the negative terminals 308 may be exposed on a first side of the housing 320. The control terminals 316 may be exposed on a second side of the housing 320. The phase terminals 314 may be exposed on a third side of the housing 320. The DC input terminals 306, 308, the phase terminals 314, and the control terminals 316 may be positioned on different sides of the housing 320. The separation of the various terminals on different sides of the housing 320 minimizes potential cross-connection issues.

The relative positions of the positive terminals 306 and the negative terminals 308 may be identified with respect to a coordinate system 301. The coordinate system 301 may be associated with a face or side of the housing 320 at which the positive terminals 306 and the negative terminals 308 are accessible. An X-axis may be associated with a direction in which the power switching modules 302 are stacked. A Y-axis may be associated with a direction perpendicular to the X-axis. For each of the power switching modules 302, the corresponding positive terminal 306 and negative terminal 308 may be aligned at a common X-coordinate. The positive terminals 306 of each of the power switching modules 302 may be aligned along a first Y-coordinate or range of Y-coordinates The negative terminals 308 of each of the power switching modules 302 may be aligned along a second Y-coordinate or range of Y-coordinates.

The power module 300 may further include one or more capacitors 304. The housing 320 may be configured to receive and house the capacitors 304. The capacitors 304 may be electrically coupled to capacitor positive terminals 310 and capacitor negative terminals 312. The capacitor positive terminal 310 and the capacitor negative terminal 312 may be configured to couple the high-voltage bus 152 to the capacitors 304. In some configurations, there may be a capacitor positive terminal 310 and a capacitor negative terminal 312 for each of the capacitors 304. In some configurations, a single capacitor 304 may have multiple capacitor positive terminals 310 and capacitor negative terminals 312. For example, in some configurations, the current rating may only be satisfied by using multiple terminals to transfer the current.

The capacitor positive terminals 310 and the capacitor negative terminals 312 may be exposed on the same side of the housing 320 as the switching module positive terminals 306 and the switching module negative terminals 308. For each of the capacitors 304, the corresponding capacitor positive terminal 310 and capacitor negative terminal 312 may be aligned at a common X-coordinate. The capacitor positive terminals 310 may be aligned along a common Y-coordinate or range of Y-coordinates (e.g., second Y-coordinate) and the capacitor negative terminals 312 may be aligned along another common Y-coordinate or range of Y-coordinates (e.g., first Y-coordinate).

The capacitor positive terminals 310 may not be aligned at the same Y-coordinate with the switching module positive terminals 306. The capacitor positive terminals 310 may be arranged to be diagonally opposite to the switching module positive terminals 306. When viewing the terminals in the coordinate system 301, the switching module positive terminals 306 may be generally aligned along the first Y-coordinate and the capacitor positive terminals 310 may be aligned along the second Y-coordinate. The capacitor positive terminals 310 may be aligned along the second Y-coordinate with the switching module negative terminals 308. The capacitor negative terminals 312 may be aligned along the first Y-coordinate (e.g., aligned in the Y-coordinate with the switching module positive terminals 306). The position of the capacitor positive terminals 310 may be offset in the Y-axis (e.g., second Y-coordinate) from the switching module positive terminals 306.

When viewing the terminal-side of the housing 320 as a rectangular plane, the rectangular plane may be divided into quadrants. The switching module positive terminals 306 may be located in a first quadrant that is diagonally opposite a second quadrant in which the capacitor positive terminals 310 are located. Likewise, the switching module negative terminals 308 may be located in a third quadrant that is diagonally opposite a fourth quadrant in which the capacitor negative terminals 312 are located. This arrangement provides benefits as will be described.

The power switching modules 302 and the capacitors 304 may be arranged in the housing 320 in a stacked or side-by-side arrangement. The capacitors 304 and the power switching modules 302 may have a same or similar cross-sectional shape and size. This may allow the components to be arranged in a compact package. For example, the power switching modules 302 and the capacitors 304 may be designed as cards or circuit boards having a common size. The power switching modules 302 may be constructed with identical electrical and cooling design. The arrangement may facilitate adding additional capacitors 304 and power switching modules 302 to extend the capability of the power module 300.

Figure 4:
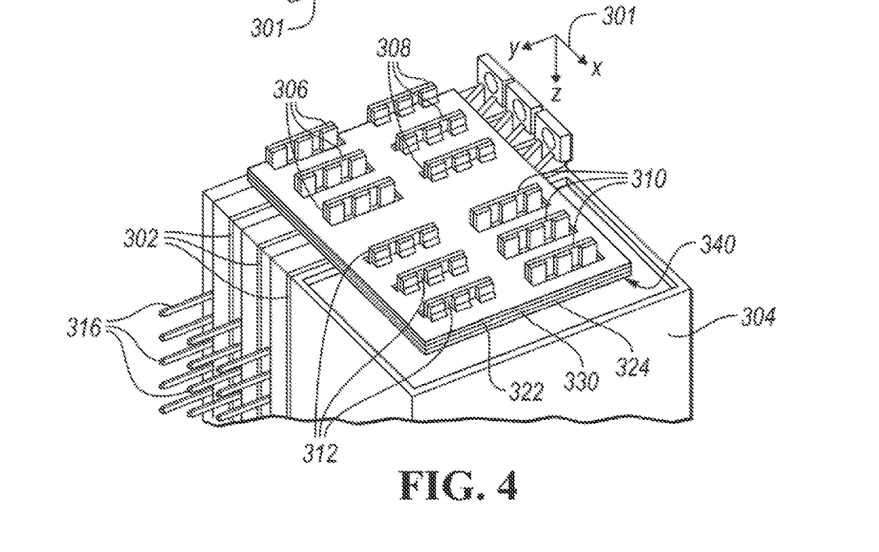
FIG. 4 depicts the power module and a laminated busbar assembly.
Figure 5:
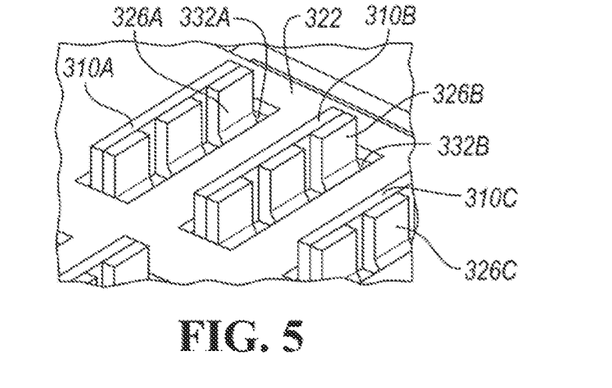
FIG. 5 depicts an expanded view of the laminated busbar assembly and terminals of the power module.

FIG. 4 depicts a laminated busbar assembly 340 that is configured to electrically couple the terminals of the capacitors 304 and the power switching modules 302. FIG. 5 depicts an expanded view of the laminated busbar coupled to the terminals. The laminated busbar assembly 340 may include a lower conductive layer 324. The lower conductive layer 324 may be constructed of copper or aluminum.

The lower conductive layer 324 may define openings through which the switching module positive terminals 306, the switching module negative terminals 308, the capacitor positive terminals 310, and the capacitor negative terminals 312 may pass. The lower conductive layer 324 may further include a first set of tabs 326 that are configured to contact corresponding terminals of the capacitors 304 and power switching modules 302. The lower conductive layer 324 may be configured to be coupled to terminals of the high-voltage bus 152 having a first polarity (e.g., positive terminal).

The laminated busbar assembly 340 may further include an upper conductive layer 322. The upper conductive layer 322 may be constructed of copper or aluminum. The upper conductive layer 322 may define openings through which the positive terminals 306, the negative terminals 308, the capacitor positive terminals 310, the capacitor negative terminals 312, and tabs of the lower conductive layer 324 may pass. The upper conductive layer 322 may include a second set of tabs that are configured to contact corresponding terminals of the capacitors 304 and the power switching modules 302.

The laminated busbar assembly 340 may further include an insulating layer 330 that is disposed between the lower conductive layer 324 and the upper conductive layer 322. The insulating layer 330 may be constructed of a dielectric material. The insulating layer 330 electrically isolates the lower conductive layer 324 from the upper conductive layer 322.

The laminated busbar assembly 340 may be configured to be attached to the terminals of the capacitors 304 and the power switching modules 302. For example, the lower conductive layer 324 may be configured to be attached to the negative terminals of the capacitors 304 and the power switching modules 302. The upper conductive layer 322 may be configured to be attached to the positive terminals of the capacitors 304 and the power switching modules 302. The lower conductive layer 324 may be attached to a positive side of the high-voltage bus and the upper conductive layer 322 may be attached to a negative side of the high-voltage bus.

The tabs 326 of the lower conductive layer pass through openings 332 defined in the upper conductive layer 322. The capacitor positive terminals 310 pass through the openings 332 in a similar manner. The lower conductive layer tabs 326 and the capacitor positive terminals 310 may be coupled together by welding. In other configurations, the tabs 326 and the capacitor positive terminals 310 may be electrically coupled using fasteners or clips. For example, a conductive clip may be placed over and in contact with the tabs 326 and terminals 310. The above discussion applies for all of the terminals and tabs. The tabs 326 in the example include three individual tab elements for each of the terminals. In other configurations, the tabs 326 may be a single tab that is approximately the same size as the corresponding terminal.

The laminated busbar assembly 340 minimizes stray inductance and simplifies the assembly process. The distributed openings and tabs of the laminated busbar assembly 340 allow for easy assembly. The tabs and terminals may be attached by welding or other metal bonding techniques. The diagonally opposite configuration of the same polarity terminals ensures a symmetric current distribution that minimizes the net current induced stray inductance and lowers the surge voltage and switching losses of the power devices.

Figure 6:
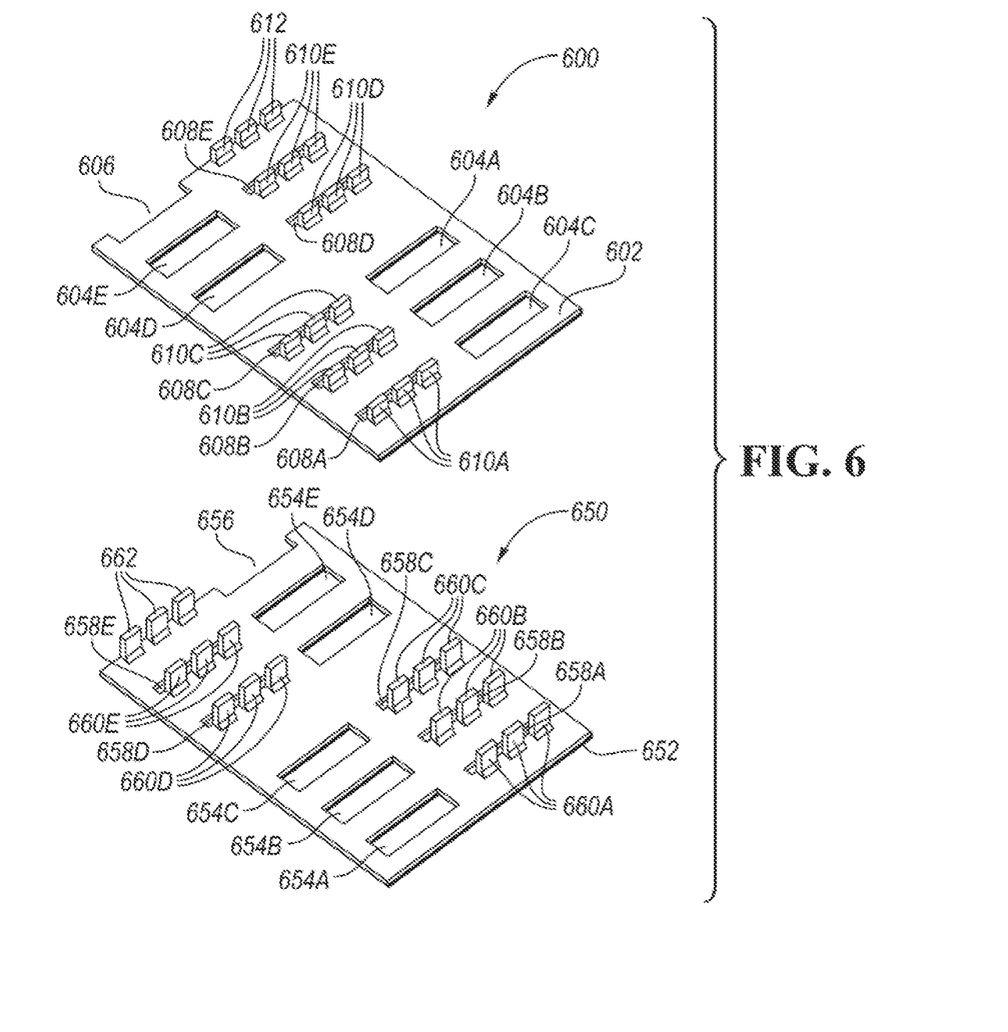
FIG. 6 depicts a possible configuration of conductive layers of the laminated busbar assembly.
Figure 7:
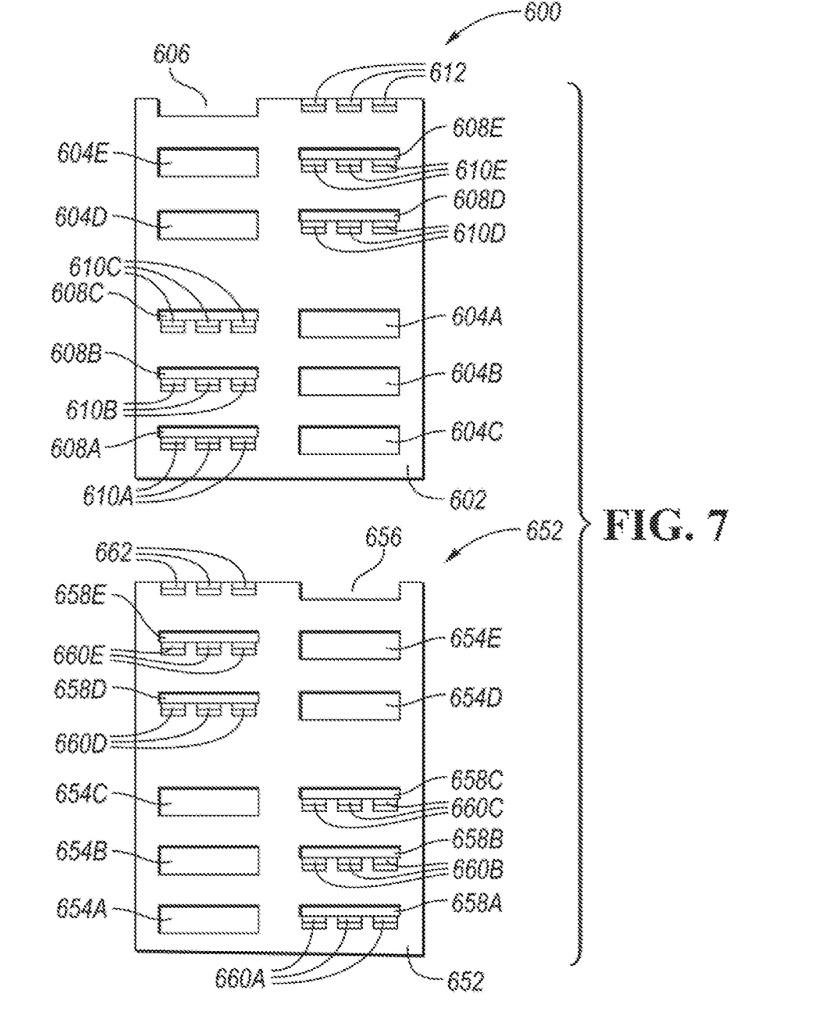
FIG. 7 depicts a top view of the conductive layers of the laminated busbar assembly.
Figure 8:
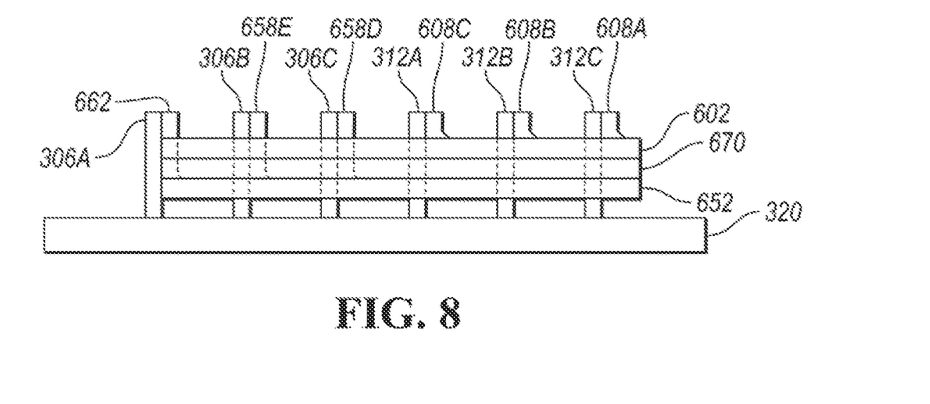
FIG. 8 depicts a possible side view of the laminated busbar assembly coupled to the power module.

FIG. 6 depicts a first view of a possible upper layer configuration 600 and a possible lower layer configuration 650 for the busbar assembly. FIG. 7 depicts a top view of the upper layer configuration 600 and the lower layer configuration 650 for the busbar assembly. FIG. 8 depicts a side view of the busbar assembly. The lower layer configuration 650 may include a lower conductive layer 652 that may be formed of copper, aluminum, or other conductive material. The lower conductive layer 652 may define a first set of openings 654. The first set of openings 654 may be configured to allow passage of the power module terminals through the lower conductive layer 652. The lower conductive layer 652 may define a second set of openings 658.

The lower conductive layer 652 may include a first set of tabs 660 that are generally perpendicular to a plane defined by the lower conductive layer 652. The openings of the second set of openings 658 may correspond to the tabs 660. The second set of openings 658 may be formed adjacent to the tabs 660 to allow passage of terminals to be attached to the adjacent tab 660. The tabs 660 may be configured to be attached to the terminals (capacitor or power switching module) that pass through the adjacent second set of openings 658. The dimensions of the first set of openings 654 and the second set of openings 658 may be different. The dimensions may be configured to ensure passage of the power module terminals through the lower conductive layer 652. The tabs 660 may include a first subset and a second subset of tabs that are arranged on the lower conductive layer 652 diagonally opposite to one another. For example, the first subset may be configured to attach to terminals of the capacitors and the second subset may be configured to attach to terminals of the power switching modules, the terminals having a same polarity.

The lower conductive layer 652 may define a first end cutout 656 or notch at an edge of the lower conductive layer 652. The first end cutout 656 may be configured to ensure isolation between the lower conductive layer 652 and a terminal (capacitor or power switching module) that passes proximate the lower conductive layer 652. The first end cutout 656 may be of smaller width than the opening of the first set of openings 654.

The tabs 660 may be formed of separate conductive material that is welded or otherwise attached to the lower conductive layer 652. The tabs 660 may be formed by punching and bending material of the lower conductive layer 652. The same punching operation may form the first set of openings 654 and the second set of openings 658. The tabs 660 may be formed from material removed from the second set of openings 658. For example, by cutting three sides of a rectangular shape, the tabs 660 may be formed by bending the material that is still retained by on one side. A tab associated with one of the second set of openings 658 may be comprised of a plurality of individual tabs or tab elements. For example, the figures depict that the tabs 660 are formed of three individual tab elements with a small gap between each. This may allow for easier manufacture as the bends may require less force to achieve. In addition, reliability may be enhanced as conductivity may be maintained when a single tab element becomes disconnected.

The first set of openings 654 and the second set of openings 658 may be arranged to receive the terminals of the capacitors 304 and the power switching modules 302. The lower conductive layer 652 may include a first end tab 662 that is aligned along an edge of the lower conductive layer 652. The first end tab 662 may be configured to attach to one of the terminals.

The upper layer configuration 600 may include an upper conductive layer 602 that may be formed of copper or aluminum. The upper conductive layer 602 may define a third set of openings 604. The third set of openings 604 may be configured to permit passage of terminals and the tabs 660 of the lower conductive layer 652. The upper conductive layer 602 may define a fourth set of openings 608. The upper conductive layer 602 may include a set of tabs 610 that are generally perpendicular to a plane defined by the upper conductive layer 602. The tabs 610 may be configured to be attached to the terminals of the capacitor or the power switching module. The fourth set of openings 608 may be adjacent to the tabs 610. The fourth set of openings 608 may be formed adjacent to the tabs 610 to allow passage of terminals to be attached to the adjacent tab 610. The dimensions of the third set of openings 604 and the fourth set of openings 608 may be different. The dimensions may be configured to ensure passage of the terminals through the upper conductive layer 602. The tabs 610 may include a third subset and a fourth subset of tabs that are arranged on the upper conductive layer 602 diagonally opposite to one another. For example, the third subset may be configured to attach to terminals of the capacitors and the fourth subset may be configured to attach to terminals of the power switching modules, the terminals having a same polarity.

The upper conductive layer 602 may define a second end cutout 606 or notch at an edge of the upper conductive layer 602. The second end cutout 606 may be configured to ensure isolation between the upper conductive layer 602 and a terminal (capacitor or power switching module) that passes proximate the upper conductive layer 602. The second end cutout 606 may be of smaller width than the opening of the third set of openings 604.

The tabs 610 may be formed of separate conductive material that is welded to the upper conductive layer 602. The tabs 610 may be formed by punching and bending the upper conductive layer 602. The same punching operation may form the third set of openings 604 and the fourth set of openings 608. The tabs 610 may be formed from material removed from the fourth set of openings 608. For example, by cutting three sides of a rectangular shape, the tabs 610 may be formed by bending the material that is still retained by one of the sides. A tab associated with one of the fourth set of openings 608 may be comprised of a plurality of individual tabs or tab elements. For example, the figures depict that each of the tabs 610 is formed of three individual tab elements with a small gap between each. This may allow for easier manufacture as the bends may require less force. In addition, reliability may be enhanced as conductivity may be maintained when a single tab element becomes disconnected.

The upper conductive layer 602 may include a second end tab 612 that is aligned along the edge of the upper conductive layer 602. The second end tab 612 may be configured to attach to one of the terminals.

In some configurations, the upper conductive layer 602 and the lower conductive layer 652 may define additional end cutouts and end tabs on an opposed edge. Such a configuration may save a small amount of conductive material to reduce cost. In some configurations, the end cutouts and end tabs may be defined as openings and tabs as previously described.

The third set of openings 604 and the fourth set of openings 608 may be arranged to receive the terminals of the capacitors 304 and the power switching modules 302. In addition, the third set of openings 604 may be configured to receive the tabs 660 of the lower conductive layer 652. The dimensions of the third set of openings 604 of the upper conductive layer 602 may be large enough to accommodate the bend/weld region of the tabs 660 of the lower conductive layer 652 to ensure proper fit without making electrical contact with the tabs 660 or the lower conductive layer 652.

An insulation layer 670 may be disposed between the upper conductive layer 602 and the lower conductive layer 652 to electrically isolate the layers from one another. The insulation layer 670 may extend into the openings defined by the conductive layers to ensure isolation. For example, some terminals may pass through first set of openings 654 of the lower conductive layer 652 to attach to the tabs 610 of the upper conductive layer 602. The insulation layer 670 may extend into the first set of openings 654 to isolate the terminals from contacting the lower conductive layer 652. As such, the insulation layer 670 may not be flat, but may have protruding areas corresponding the openings of the conductive layers for extending into the conductive layers.

The conductive layers of the laminated busbar assembly may be generally shaped as a rectangle and the subsets of the tabs (e.g., the first subset, the second subset, the third subset, and the fourth subset) are each located in a different quadrant of the rectangle.

The busbar assembly may be integrated with a traction inverter 126 or power module. The traction inverter 126 may include a plurality of power switching stages 302 configured to convert a DC voltage between a first set of positive terminals 306 and negative terminals 308 to an AC current at output terminals 314. The traction inverter 126 may further include a plurality of capacitors 304 having a second set of positive terminals 310 and negative terminals 312. The traction inverter 126 may further include a housing 320 configured to receive and arrange the power switching stages 302 and the capacitors 304 such that the first set (306, 308) and the second set (310, 312) of positive and negative terminals extend from a surface of the housing 320 and the first set of positive terminals 306 are diagonally opposite to the second set of positive terminals 310 and the first set of negative terminals 308 are diagonally opposite to the second set of negative terminals 312. The traction inverter 126 may further include a lower busbar conductive layer 652 defining a first set of openings 654 through which the first set and the second set of positive and negative terminals pass and including a first set of tabs 660 extending generally perpendicular from the lower busbar conductive layer 652 and attached to the negative terminals 308, 312. The traction inverter 126 may further include an upper busbar conductive layer 602 defining a second set of openings 604 generally aligned with the first set of openings 654 through which the positive and negative terminals pass and including a second set of tabs 610 extending generally perpendicular from the upper busbar conductive layer 602 and attached to the positive terminals 306, 310. The first set of tabs 660 extends through some of the openings of the second set 604. The traction inverter 126 may further include a busbar insulation layer 670 between the lower busbar conductive layer 652 and the upper busbar conductive layer 602. The busbar assembly may further include any of the features previously described above.

The traction inverter 126 and laminated busbar assembly may be integrated into a vehicle. The vehicle may include a high-voltage bus 152 coupled to a traction battery 124. The vehicle may include a traction inverter 126 that includes power switching stages 302 and capacitors 304 having positive 306, 310 and negative 308, 312 terminals, wherein the positive and negative terminals of the power switching stages 302 and the capacitors 304 are arranged such that terminals of the power switching stages 302 having a same polarity as terminals of the capacitors 304 are positioned diagonally opposite on a surface defined by a housing 320 in which the power switching stages 302 and capacitors 304 are mounted. The vehicle may further include a laminated busbar configured to couple the high-voltage bus to the positive and negative terminals, the laminated busbar 340.

The laminated busbar 340 may include a lower conductive layer 654 defining a first set of openings 654 through which the positive and negative terminals pass and including a first set of tabs 660 extending generally perpendicular from the lower conductive layer 654 and attached to the negative terminals 308, 312. The laminated busbar may further include an upper conductive layer 602 defining a second set of openings 604 generally aligned with the first set 654 through which the positive and negative terminals pass and including a second set of tabs 610 extending generally perpendicular from the upper conductive layer 602 and attached to the positive terminals 306, 310, wherein the first set of tabs 660 extends through some of the openings 604 of the second set. The laminated busbar may further include an insulation layer 670 between the lower conductive layer 652 and the upper conductive layer 602. The laminated busbar may further include any of the features previously described above.

The arrangement of the terminals of the power switching modules and the capacitor reduces stray inductances. The arrangement permits a compact package that reduces the distance between terminals of the capacitors and the power switching modules. The diagonally opposite arrangement of similar polarity terminals of the capacitors and power switching modules ensures symmetric DC current distribution on the laminated busbar. The configuration also facilitates assembly of the power module.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A busbar assembly comprising:
   a lower conductive layer defining a first set of openings for passage of terminals therethrough and including a first set of tabs adjacent to some of the first set of openings and extending generally perpendicular from the lower conductive layer for attaching to terminals of a first polarity;
   an upper conductive layer defining a second set of openings generally aligned with the first set for passage of terminals and including a second set of tabs adjacent to a subset of the second set of openings and extending generally perpendicular from the upper conductive layer for attaching to terminals of a second polarity, wherein the first set of tabs extends through the openings of the second set; and
   an insulation layer between the lower conductive layer and the upper conductive layer.

2. The busbar assembly of claim 1, wherein the first set of tabs includes a first subset and a second subset of tabs and the first subset of tabs are arranged on the lower conductive layer diagonally opposite to the second subset of tabs.

3. The busbar assembly of claim 2, wherein the second set of tabs includes a third subset and a fourth subset of tabs and the third subset is arranged on the upper conductive layer diagonally opposite to a fourth subset of tabs.

4. The busbar assembly of claim 3, wherein the lower conductive layer and the upper conductive layer are generally shaped as a rectangle and the first subset, the second subset, the third subset, and the fourth subset are each located in a different quadrant of the rectangle.

5. The busbar assembly of claim 1, wherein the first and second sets of tabs are bent from conductive material of the lower conductive layer and the upper conductive layer, respectively.

6. The busbar assembly of claim 1, wherein the first and second sets of tabs are comprised of conductive material attached to the lower conductive layer and the upper conductive layer, respectively.

7. The busbar assembly of claim 1, wherein the tabs are configured such that there are a predetermined number of tab elements associated with each of the openings that are adjacent to the tabs.

8. The busbar assembly of claim 1, wherein the tabs are configured such that there is a single tab extending across a length of an adjacent one of the openings.

9. The busbar assembly of claim 1, wherein the first set of openings includes a first subset of openings that are directly adjacent to each of the tabs of the first set of tabs and a second subset of openings that are not directly adjacent to any of the tabs of the first set.

10. The busbar assembly of claim 9, wherein an area defined by each of the openings of the first subset is less than an area defined by each of the openings of the second subset.

11. The busbar assembly of claim 10, wherein the second set of openings includes a third subset of openings that are directly adjacent to each of the tabs of the second set of tabs and a fourth subset of openings that are not directly adjacent to any of the tabs of the second set.

12. The busbar assembly of claim 11, wherein an area defined by each of the openings of the third subset is less than an area defined by each of the openings of the fourth subset.

13. The busbar assembly of claim 12, wherein the fourth subset of openings are aligned with the first set of tabs such that the first set of tabs pass through the fourth subset of openings and are exposed above the upper conductive layer.

14. The busbar assembly of claim 1, wherein the lower conductive layer and the upper conductive layer include tabs formed at an edge of the respective layer configured to contact connecting terminals.

* * * * *